(12) United States Patent
Nakamura et al.

(10) Patent No.: US 7,569,496 B2
(45) Date of Patent: Aug. 4, 2009

(54) METHOD FOR MANUFACTURING SIC SEMICONDUCTOR DEVICE

(75) Inventors: Hiroki Nakamura, Handa (JP); Yoshihiro Miyoshi, Tajimi (JP); Eiichi Okuno, Mizuho (JP)

(73) Assignee: DENSO CORPORATION, Kariya (JP)

( * ) Notice: Subject to any disclaimer, the term of this patent is extended or adjusted under 35 U.S.C. 154(b) by 16 days.

(21) Appl. No.: 11/730,600

(22) Filed: Apr. 3, 2007

(65) Prior Publication Data

US 2008/0090383 A1 Apr. 17, 2008

(30) Foreign Application Priority Data

Apr. 3, 2006 (JP) .............................. 2006-101930

(51) Int. Cl.
   *H01L 21/265* (2006.01)
   *H01L 31/0312* (2006.01)
(52) U.S. Cl. ..................... 438/766; 438/931; 438/522; 257/77
(58) Field of Classification Search .................... 257/77, 257/288; 438/931, 766, 105, 613
See application file for complete search history.

(56) References Cited

U.S. PATENT DOCUMENTS

| | | | | | |
|---|---|---|---|---|---|
| 4,865,732 | A | * | 9/1989 | Garrant et al. ............... | 210/232 |
| 6,159,884 | A | * | 12/2000 | Flemish et al. ................. | 501/88 |
| 6,500,731 | B1 | * | 12/2002 | Nakagawa et al. ........... | 438/455 |
| 7,083,903 | B2 | * | 8/2006 | Edelberg et al. ............. | 430/329 |
| 2005/0029646 | A1 | * | 2/2005 | Ueda et al. .................... | 257/687 |
| 2006/0220027 | A1 | * | 10/2006 | Takahashi et al. .............. | 257/77 |
| 2007/0089761 | A1 | * | 4/2007 | Banerjee et al. ................ | 134/34 |
| 2007/0167026 | A1 | * | 7/2007 | Miura ......................... | 438/758 |

FOREIGN PATENT DOCUMENTS

| | | | |
|---|---|---|---|
| JP | 2000-012482 | * | 1/2000 |
| JP | 2001-068428 | * | 3/2001 |
| JP | WO 2005/076327 | * | 1/2005 |
| JP | A-2005-260267 | | 9/2005 |
| JP | A-2005-303010 | | 10/2005 |
| JP | A-2005-353771 | | 12/2005 |

OTHER PUBLICATIONS

Guy, O.J. et al., *Improved Schottky Contacts to Annealed 4H-Sic Using a Protective Carbon Cap: Investigated Using Current Voltage Measurements and Atomic Force Microscopy*, Diamond and Related Materials, 15 , 2006, pp. 1472-1477.
Office Action dated Feb. 15, 2008 in corresponding German Patent Application No. 10 2007 016 085.4 (and English translation).

* cited by examiner

*Primary Examiner*—Steven Loke
*Assistant Examiner*—David Goodwin
(74) *Attorney, Agent, or Firm*—Posz Law Group, PLC

(57) ABSTRACT

A method for manufacturing a SiC semiconductor device includes: forming an impurity layer in a SiC layer; and forming an oxide film on the SiC layer. The forming the impurity layer includes: implanting an impurity ion in the SiC layer; forming a carbon layer on the SiC layer; heating the SiC layer for activating the implanted impurity in the SiC layer covered with the carbon layer; and removing the carbon layer from the SiC layer. The forming the carbon layer includes: coating a resist on the SiC layer; and heating the resist for evaporating organic matter in the resist so that the resist is carbonized. The forming the oxide film is performed after the removing the carbon layer.

13 Claims, 6 Drawing Sheets

METHOD FOR MANUFACTURING SIC SEMICONDUCTOR DEVICE

CROSS REFERENCE TO RELATED APPLICATION

This application is based on Japanese Patent Application No. 2006-101930 filed on Apr. 3, 2006, the disclosure of which is incorporated herein by reference.

FIELD OF THE INVENTION

The present invention relates to a method for manufacturing a SiC semiconductor device.

BACKGROUND OF THE INVENTION

It has been confirmed that, in an SiC power device, Si (silicon) escapes from an SiC surface on account of an activation heat treatment which is required in forming an impurity layer, so surface roughening appears. When the Si escape occurs, a carbon-rich layer is formed in the surface of an SiC substrate. Unless the carbon-rich layer is removed, drawbacks such as the increase of a leakage current arise in device characteristics. Therefore, a sacrifice oxidation step and a sacrifice oxidation film removal step are added in order to remove the carbon-rich layer.

The "sacrifice oxidation step" termed here is a thermal oxidation step. In performing the thermal oxidation step, a large difference in the rate of thermal oxidation is exhibited between in a region doped with an impurity and in a region not doped with the impurity. More specifically, an accelerated oxidation in which the thermal oxidation rate of the impurity-doped region becomes greater than that of the impurity-undoped region proceeds, so the thermal oxidation film of the doped region becomes thicker than that of the undoped region.

For this reason, when the sacrifice oxidation film has been removed by an HF treatment, there is formed a "constriction" in which, since the oxidation film of the impurity-doped region is thicker, it becomes concave as compared with the impurity-undoped region. The "constriction" becomes a factor for the appearance of a thickness nonuniformity at the formation of a gate oxide film, and it degrades the reliability of the gate oxide film. FIG. 9 is a sectional view of the vicinity of the gate oxide film 100 as shows this situation. As seen from the figure, a large thickness nonuniformity appears in the gate oxide film 100.

In this regard, a method for suppressing the surface roughening has been proposed in JP-A-2005-260267. Concretely, after an organic film pattern of photo-resist or the like is formed, impurity ions are implanted into the organic film pattern. Thereafter, a graphite film is formed by carbonizing the organic film, and high-temperature annealing is carried out using the graphite film as a mask.

According to such a method, owing to the masking with the graphite film into which the organic film has been carbonized, the surface roughening under the mask can be suppressed.

Also, a method for suppressing the surface roughening has been proposed in JP-A-2005-303010. Concretely, after a drift layer is epitaxially grown, Si is sublimated by a vacuum high-temperature heat treatment, thereby to form a uniform carbon layer. Activation annealing is performed by utilizing the carbon layer as a cap layer, whereby the impurity layer is activated. In case of employing the carbon layer in this manner, any impurity contained in an organic solvent as in the case of the organic type graphite film does not diffuse into the SiC substrate, and any influence can be prevented from being exerted on the device characteristics.

With the method stated in JP-A-2005-260267, however, the graphite film is formed of the organic film pattern employed for the ion implantation, so that a part opened for the ion implantation is not formed with the graphite film and is not protected.

In the open part not formed with the graphite film, accordingly, Si is sublimated by the high-temperature annealing, and the carbon-rich layer is formed to roughen the substrate surface. In the fabrication of the device, therefore, a sacrifice oxidation step must be added in order to remove this carbon-rich layer, and the "constriction" ascribable to the accelerated oxidation as stated above cannot be prevented.

Besides, in the case of the method stated in JP-A-2005-303010, after the carbon layer has been formed, an $SiO_2$ film is formed on the carbon layer and is worked by photo-etching in order to selectively perform ion implantation, whereupon the ion implantation is performed.

However, when the $SiO_2$ film is formed on the carbon layer being amorphous, the close adhesion of the film cannot be ensured. That is, when a microscopic pattern is worked, the $SiO_2$ film serving as a mask material peels off, and it cannot function as the mask for the ion implantation, so that a desired device performance fails to be attained.

Besides, JP-A-2005-303010 states a method wherein a carbon layer is formed after an ion implantation step for forming an impurity layer has been executed. If, as stated before, the carbon layer is formed by epitaxially growing the drift layer and then directly sublimating the Si of the surface of the drift layer, this carbon layer can be formed by the series of steps. However, if the carbon layer is formed after the execution of the ion implantation step, steps for the ion implantation step must be separately performed.

Further, in the case where the carbon layer is formed after the execution of the ion implantation step, impurity regions have already been formed, and parts of disordered crystal structure have already appeared on that occasion. Therefore, when the step of forming the carbon layer is performed at the high temperatures of at least 1100° C. to at most 1400° C., eventually the parts become different in a carbonizing rate (namely, the sublimating rate of the Si) as compared with the SiC surface where a crystal structure is not disordered. Consequently, when the carbon layer is removed, the "constriction" appears in the same manner as in the sacrifice oxidation and the sacrifice oxidation film removal. As a result, the thickness nonuniformity of the gate oxide film cannot be prevented, and the reliability of the gate film cannot be ensured.

Thus, it is required for an SiC semiconductor device to suppress the thickness nonuniformity of an oxide film which is formed on an SiC surface.

SUMMARY OF THE INVENTION

In view of the above-described problem, it is an object of the present disclosure to provide a method for manufacturing a SiC semiconductor device.

According to an aspect of the present disclosure, a method for manufacturing a SiC semiconductor device includes: forming an impurity layer in a SiC semiconductor layer; and forming an oxide film on the SiC semiconductor layer. The forming the impurity layer includes: implanting an impurity ion in the Si C semiconductor layer; forming a carbon layer on the SiC semiconductor layer; heating the SiC semiconductor layer for activating the implanted impurity in the SiC semiconductor layer, wherein the SiC semiconductor layer including the impurity layer is covered with the carbon layer; and removing the carbon layer from the SiC semiconductor layer. The forming the carbon layer includes: coating an organic solvent resist on a surface of the SiC semiconductor layer including the impurity layer; and heating the organic solvent resist for evaporating organic matter in the organic solvent resist so that the organic solvent resist is carbonized. The forming the oxide film is performed after the removing the carbon layer.

In the above method, the carbon layer made from the resist is used as a mask, which contacts the SiC semiconductor layer with excellent adhesiveness, when the impurity in the SiC semiconductor layer is activated. Accordingly, the Si escape from the SiC semiconductor layer is prevented. Thus, the oxide film is appropriately formed on the SiC semiconductor layer, and device characteristics of the SiC device are improved.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
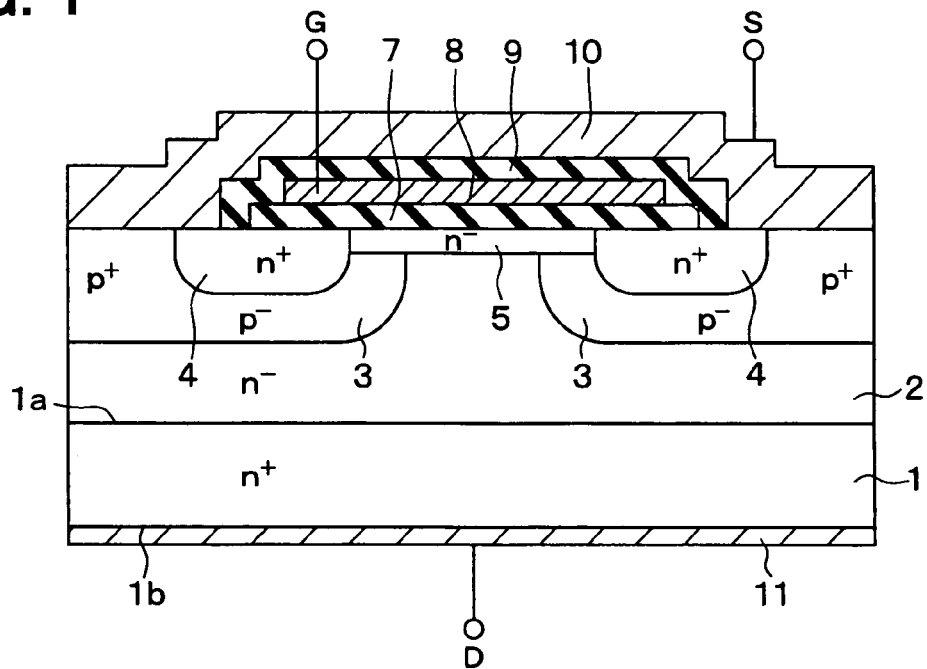
FIG. 1 is a cross sectional view showing a SiC semiconductor device.

FIG. 1 shows a sectional view of an n-channel type planar MOSFET (vertical power MOSFET) of normally-OFF type which has been manufactured by a method for manufacturing an SiC semiconductor device illustrated in this embodiment. This device is well suited for application to the rectifier of an inverter or a vehicular alternator. The structure of the vertical power MOSFET will be described with reference to FIG. 1.

An $n^+$-type substrate 1 made of silicon carbide has a principal surface 1a which is the upper surface of this substrate, and a rear surface 1b which is the lower surface thereof opposite to the principal surface 1a. An $n^-$-type epitaxial layer 2 which is made of silicon carbide having a dopant concentration lower than that of the substrate 1 is stacked on the principal surface 1a of the $n^+$-type substrate 1.

A p-type base region 3 is formed in the surface layer part of the $n^-$-type epitaxial layer 2. The p-type base region 3 is formed using B (boron), Al (aluminum) or Ge (germanium) as a dopant, and it has a concentration of, at least, about $1 \times 10^{17}$ $cm^{-3}$. Besides, the central part of the p-type base region 3 (left or right end position in FIG. 1) is locally heightened in a p-type impurity concentration, and it functions as a contact region. This part may well be formed deeper than the other region, and it functions also as a deep base region in that case.

Besides, an $n^+$-type source region 4 shallower than the p-type base region 3 is formed in the surface layer part of the p-type base region 3. In addition, an $n^-$-type SiC layer 5 is extended in the surface part of the p-type base region 3 so as to join the $n^+$-type source region 4 and the $n^-$-type epitaxial layer 2. The $n^-$-type SiC layer 5 has been formed by epitaxial growth, and it functions as a channel forming layer during the operation of the device. Hereinbelow, the $n^-$-type SiC layer 5 shall be termed the "surface channel layer".

A gate oxide film 7 is formed on the upper surface of the surface channel layer 5 and the upper surface of the $n^+$-type source region 4 by thermal oxidation, and a gate electrode 8 is formed on the gate oxide film 7. The gate electrode 8 is covered with an insulator film 9 which is made of an LTO (Low Temperature Oxide) or the like, and a source electrode 10 which is electrically connected with the $n^+$-type source region 4 and the p-type base region 3 is formed on the insulator film 9. In addition, a drain electrode 11 is formed on the rear surface 1b of the $n^+$-type substrate 1. Thus, the vertical power MOSFET is configured.

Next, a manufacturing process for the vertical power MOSFET shown in FIG. 1 will be described with reference to FIGS. 2A-2C through FIGS. 5A and 5B.

Figure 2A:
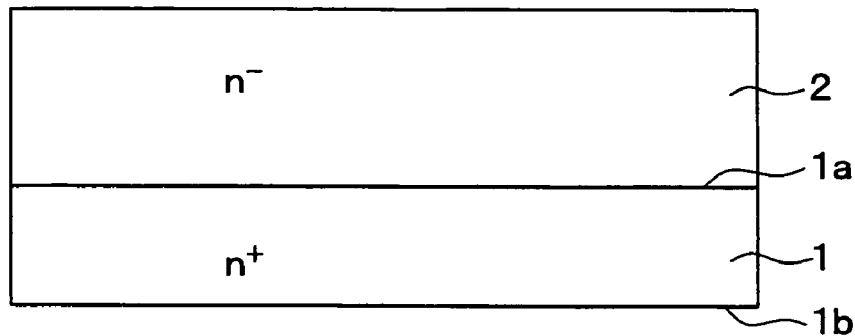
FIGS. 2A to 2C are cross sectional views explaining a method for manufacturing the SiC semiconductor device.

In a step shown in FIG. 2A, first, a semiconductor substrate made of n-type 4H, 6H or 3C—SiC, namely, an $n^+$-type substrate 1 is prepared. By way of example, as the $n^+$-type substrate 1, one whose thickness is about 400 μm is prepared. In addition, an $n^-$-type epitaxial layer 2 being 5 μm thick is epitaxially grown on the principal surface 1a of the $n^+$-type substrate 1. In this case, the $n^-$-type epitaxial layer 2 is obtained as the same crystal as that of the underlying substrate 1, and it becomes an n-type 4H, 6H or 3C—SiC layer.

Figure 2B:
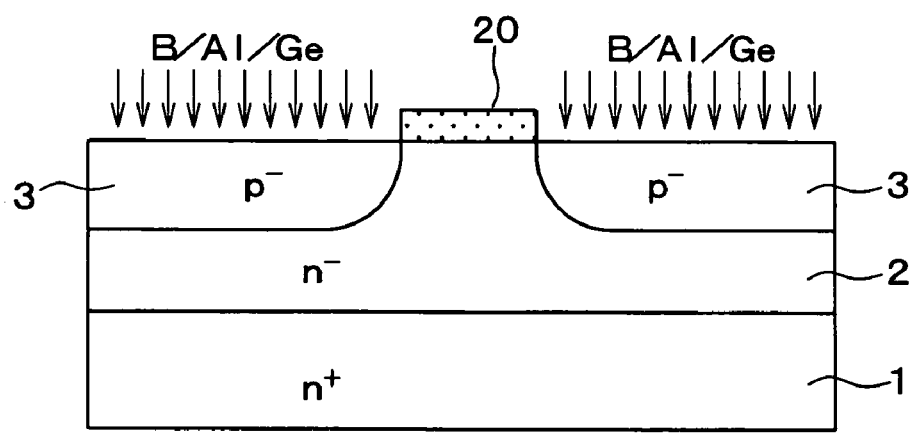
Figure 2C:
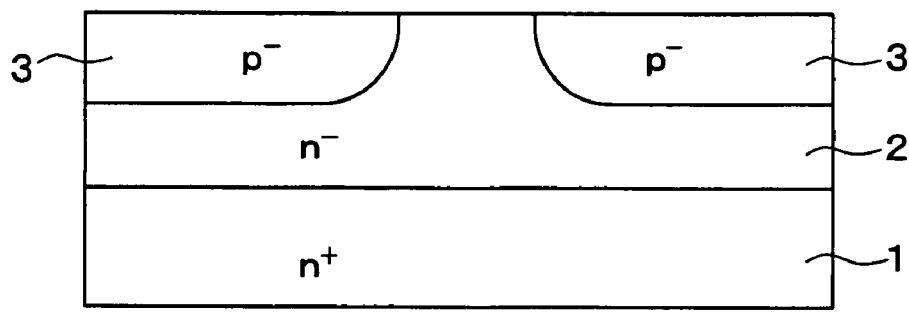

In steps shown in FIGS. 2B and 2C, after an LTO film 20 is arranged on the $n^-$-type epitaxial layer 2, the LTO film 20 is patterned, thereby to denude a position at which a $p^-$-type base region 3 is to be formed. Using the LTO film 20 as a mask, a p-type impurity B, Al or Ge is introduced by ion implantation. Ion implantation conditions on this occasion are set at, for example, a temperature of 700° C. and a dose of $1 \times 10^{16}$ $cm^{-2}$. Thus, the $p^-$-type base region 3 is formed. Thereafter, the LTO film 20 is removed.

Figure 3A:
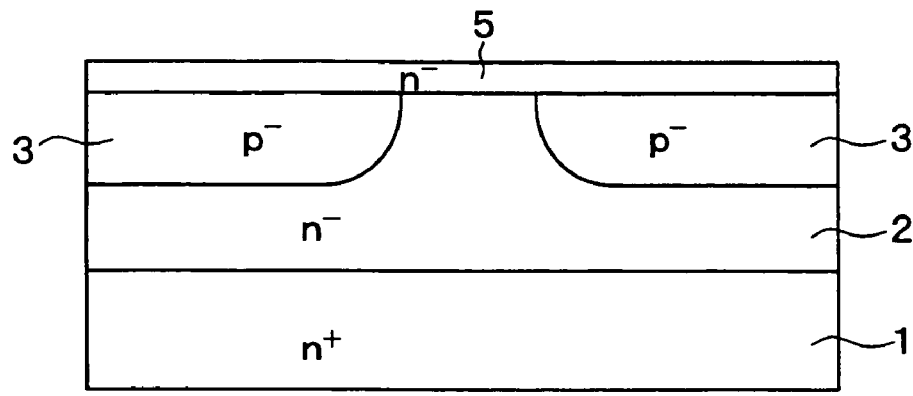
FIGS. 3A to 3C are cross sectional views explaining the method for manufacturing the SiC semiconductor device.

In a step shown in FIG. 3A, a surface channel layer 5 is epitaxially grown on the $n^-$-type epitaxial layer 2 including the $p^-$-type base region 3, by chemical vapor deposition (CVD).

On this occasion, in order to make the vertical power MOSFET the normally-OFF type, the thickness (film thickness) of the surface channel layer 5 is set so as to become less than the sum between the stretching magnitude of a depletion layer which spreads from the p-type base region 3 into the surface channel layer 5 and the stretching magnitude of a depletion layer which spreads from a gate oxide film 7 into the surface channel layer 5, at the time when a voltage is not applied to a gate electrode 8.

Concretely, the stretching magnitude of the depletion layer which spreads from the p-type base region 3 into the surface channel layer 5 is determined by the built-in voltage of the P-N junction between the surface channel layer 5 and the p-type base region 3. On the other hand, the stretching magnitude of the depletion layer which spreads from the gate oxide film 7 into the surface channel layer 5 is determined by the charges of the gate oxide film 7 and the difference between the work functions of the gate electrode 8 (metal) and the surface channel layer 5 (semiconductor). Therefore, the film thickness of the surface channel layer 5 is determined on the basis of these facts.

Such a vertical power MOSFET of normally-OFF type can prevent a current from flowing, even in a state where the voltage cannot be applied to the gate electrode due to a fault or the like. Therefore, the MOSFET of normally-OFF type can ensure safety as compared with one of normally-ON type.

Figure 3B:
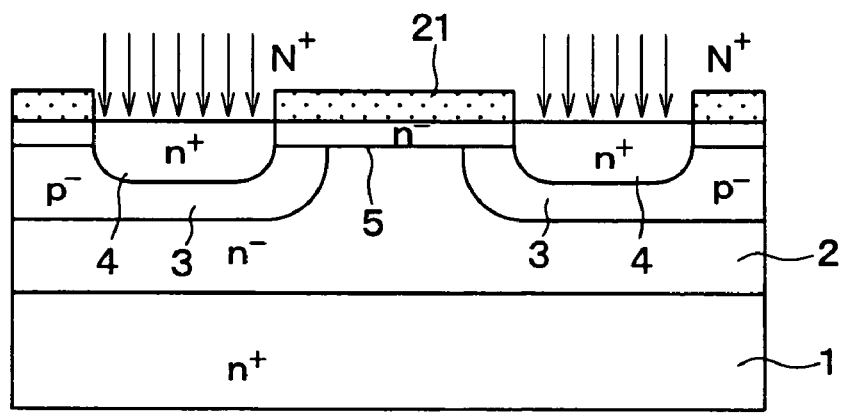

In a step shown in FIG. 3B, after an LTO film 21 is arranged on the surface channel layer 5, the LTO film 21 is patterned, thereby to denude a position at which an $n^+$-type source region 4 is to be formed. In addition, using the LTO film 21 as a mask, an n-type impurity such as N (nitrogen) is introduced by ion implantation, thereby to form the $n^+$-type source region 4. Ion implantation conditions on this occasion are set at a temperature of 700° C. and a dose of $1 \times 10^{15}$ cm$^{-2}$.

Figure 3C:
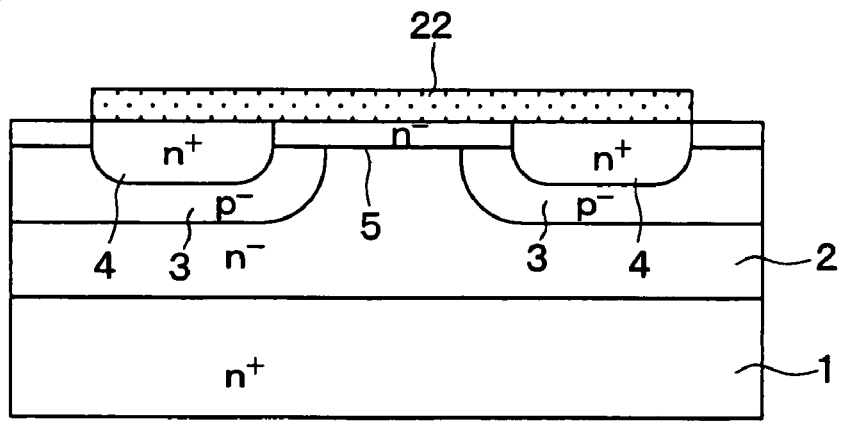

In a step shown in FIG. 3C, subsequently, the LTO film 21 is removed. Thereafter, an LTO film 22 is arranged on the predetermined region of the surface channel layer 5 and is patterned by employing a photo-resist process, thereby to denude the surface channel layer 5 which is formed at the position of the $p^-$-type base region 3 to become a contact region with a source electrode 10 as stated before.

Figure 4A:
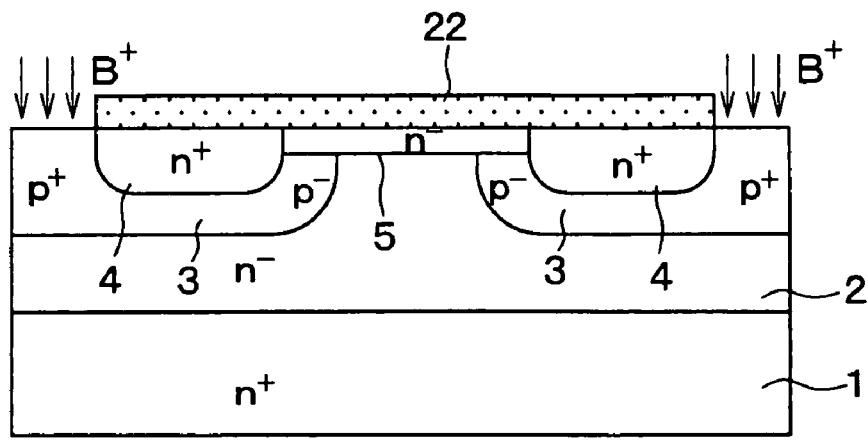
FIGS. 4A to 4C are cross sectional views explaining the method for manufacturing the SiC semiconductor device.

In a step shown in FIG. 4A, using the LTO film 22 as a mask, ions $B^+$ are implanted into the surface channel layer 5 on the $p^-$-type base region 3, thereby to form the contact region in which the p-type impurity of the base region 3 has its concentration locally heightened at the position that does not overlap the $n^+$-type source region 4.

Figure 4B:
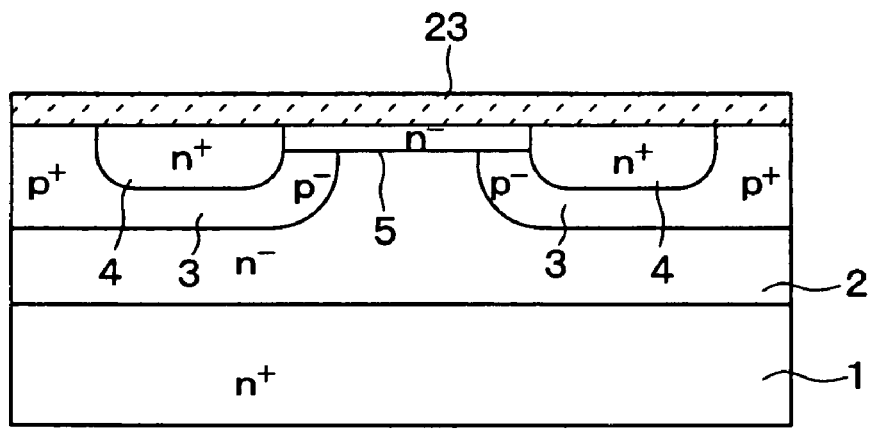

In a step shown in FIG. 4B, after the LTO film 22 is removed, a resist 23 is formed on the surfaces of the $p^-$-type base region 3, $n^+$-type source region 4 and surface channel layer 5. On this occasion, when the resist 23 is formed by spin coating or spray coating, favorably the film thickness of the resist 23 becomes uniform.

As the resist 23, it is possible to employ an organic type solvent as to which, when an organic substance is vaporized, the remaining materials are carbonized. It is possible to employ an organic type solvent of positive type, for example, a resist for i-beam photolithography, a resist for Deep-UV lithography, a resist for ArF lithography, or a resist for electron-beam lithography.

Figure 6:
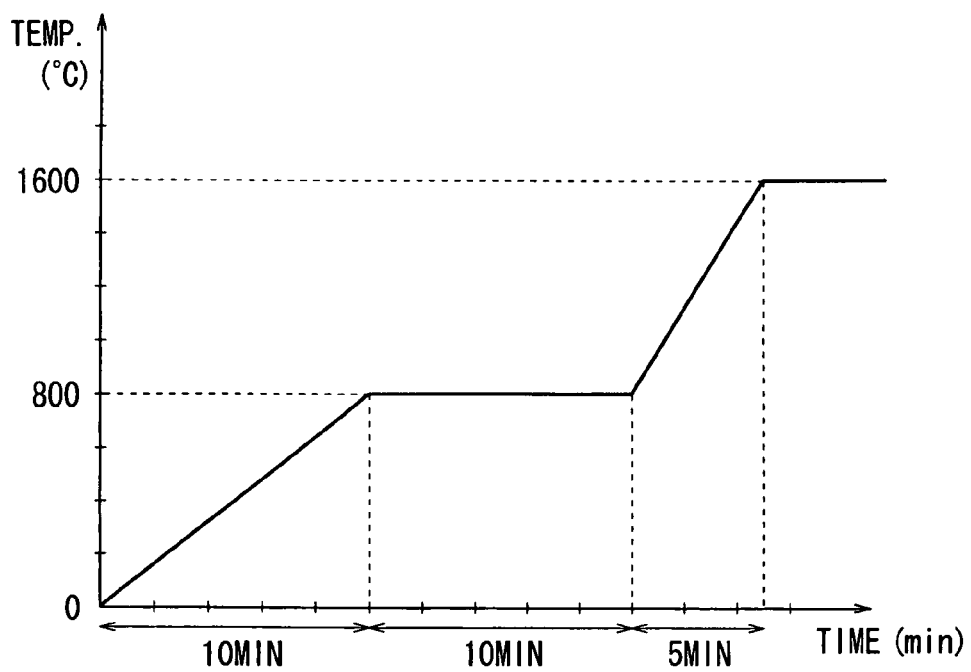
FIG. 6 is a graph showing a thermal process profile in the method for manufacturing the SiC semiconductor device.

Besides, on the basis of a heat treatment profile shown in FIG. 6, the organic substance contained in the resist 23 is vaporized to carbonize the resist 23 and to form a carbon layer, and the impurities contained in the $p^-$-type base region 3 and the $n^+$-type source region 4 are activated.

Concretely, first of all, an atmosphere pressure in an apparatus for performing a heat treatment is brought into a reduced-pressure atmosphere, for example, a vacuum state of, at most, $1 \times 10^{-4}$ Pa, and Ar (argon) is introduced into the apparatus, thereby to establish an Ar atmosphere. Subsequently, the resultant substrate is heated to a temperature of at least 200° C. and at most 850° C. at a sublimation rate of at most 80° C./min. By way of example, the resultant substrate is heated to 800° C. by raising the temperature thereof at a temperature rise rate of 80° C./min for 10 minutes. Besides, this temperature is held for, for example, 10 minutes.

The temperature rise profile is a profile for carbonizing the resist 23, and it is lower in the heat treatment temperature and lower in the sublimation rate as compared with the profile of the heating for activating the impurities. The reason why the heat treatment temperature is set at, at least 200° C. and at most 850° C., is that the resist 23 is reliably carbonized before the activation of the impurities. The reason why the sublimation rate is set at, at most 80° C./min, is that when the temperature is raised too fast, the organic substance contained in the resist 23 boils abruptly, so the resist 23 might break due to air bubbles generated by the boiling.

Besides, since the heat treatment temperature is held at, at most 850° C. for the predetermined time period, the organic substance in the resist 23 can be vaporized more reliably, and the carbon layer in which the resist 23 is carbonized can be reliably formed. In addition, since the interior of the apparatus is held in the Ar atmosphere, oxygen remaining in the apparatus can be lessened, and the resist 23 can be prevented from being burnt by the remaining oxygen, in the course of the formation of the carbon layer.

Further, since the carbon layer is formed by carbonizing the resist 23, this carbon layer can be formed so as to cover the whole surfaces of the $p^-$-type base region 3 as well as the $n^+$-type source region 4 and the surface channel layer 5.

In addition, since the temperature rise rate may well be heightened after the formation of the carbon layer, the temperature rise rate is heightened to at least 160° C./min, and the resultant substrate is quickly heated to the heat treatment temperature for activating the impurities. By way of example, the resultant substrate is heated from 800° C. to 1600° C. by raising the temperature at 160° C./min for 5 minutes. Thus, the impurities contained in the $p^-$-type base region 3 and the $n^+$-type source region 4 can be activated.

On this occasion, owing to the state where the $p^-$-type base region 3 as well as the $n^+$-type source region 4 and the surface channel layer 5 are covered with the carbon layer, Si (silicon) can be prevented from escaping from the surfaces of the regions and the layer, and a carbon-rich layer can be prevented from being formed. Accordingly, the step of forming a sacrifice oxidation film or the step of removing the sacrifice oxidation film need not be performed prior to the succeeding step of forming the gate oxide film 7.

Incidentally, since the carbon layer is favorable in its close adhesion with SiC forming the underlying regions (the $p^-$-type base region 3 as well as the $n^+$-type source region 4 and the surface channel layer 5), it does not peel off the underlying regions, and the heat treatment step for the impurity activation can be performed in the state where the underlying regions are reliably covered.

Figure 4C:
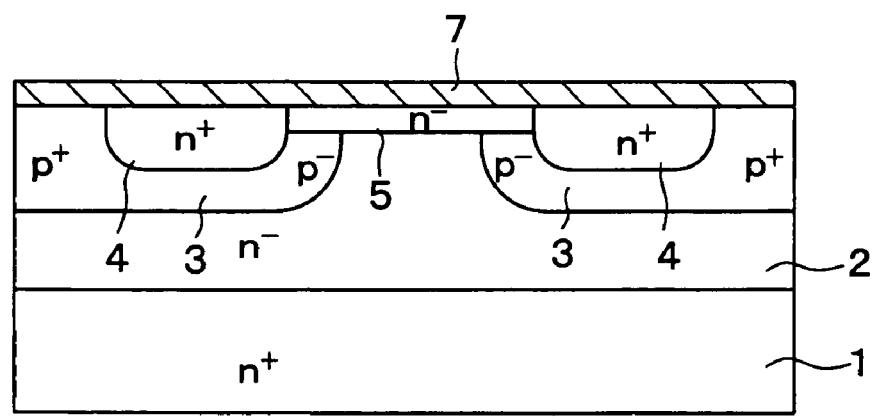

In a step shown in FIG. 4C, the carbon layer is removed. Concretely, a thermal oxidation step is performed at a low temperature of at most 850° C., for example, at about 800° C., at which the SiC is not oxidized and at which the Si escape does not occur, whereby the carbon layer is burnt and removed. On this occasion, the thermal oxidation step of the carbon layer may be performed by either of dry oxidation and wet oxidation. Besides, if necessary, a surface cleaning step based on an HF treatment is carried out, whereby the surface state of the resultant substrate can be made good.

Thereafter, the gate oxide film 7 is formed on the $p^-$-type base region 3 as well as the $n^+$-type source region 4 and the surface channel layer 5 by, for example, wet oxidation in which an atmosphere temperature is set at 1080° C. (including a pyrogenic method based on $H_2+O_2$).

On this occasion, the impurity concentrations are different in the $p^-$-type base region 3 as well as the $n^+$-type source region 4 and the surface channel layer 5, so that an accelerated oxidation takes place in the part of high impurity concentration. As stated above, however, the surfaces themselves of the $p^-$-type base region 3 as well as the $n^+$-type source region 4 and the surface channel layer 5 which are the underlying regions are not formed with any "constriction" which is formed by performing the sacrifice oxidation film forming step and the sacrifice oxidation film removing step. Therefore, even when the gate oxide film 7 is formed, the thickness nonuniformity of the gate oxide film 7 can be suppressed, and it is possible to prevent the reliability of the gate oxide film 7 from degrading, in turn, device characteristics from worsening.

Figure 5A:
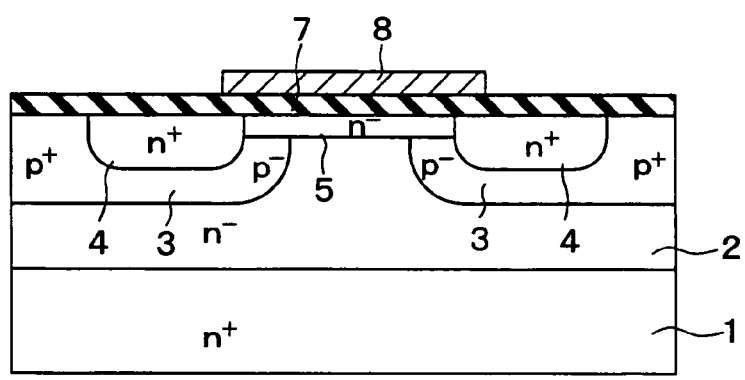
FIGS. 5A to 5B are cross sectional views explaining the method for manufacturing the SiC semiconductor device.

In a step shown in FIG. 5A, a polycrystal silicon layer is deposited on the gate oxide film 7 by, for example, LPCVD. A film formation temperature on this occasion is set at, for example, 600° C. Besides, the polycrystal silicon layer is patterned, thereby to form the gate electrode 8.

Figure 5B:
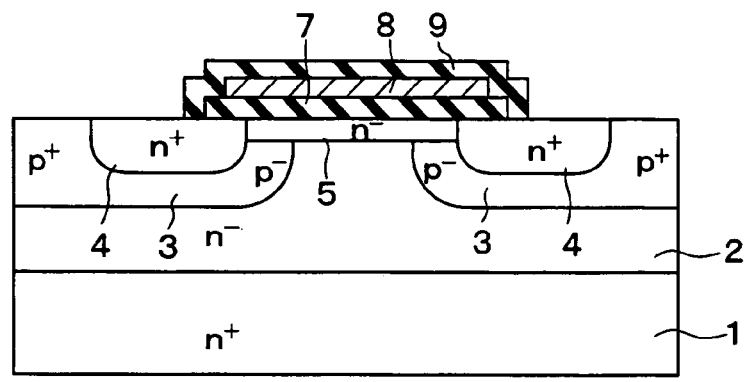

In a step shown in FIG. 5B, subsequently, the unnecessary part of the gate oxide film 7 is removed, and an insulator film 9 made of an LTO is formed at, for example, 425° C. Further, the insulator film 9 is annealed at about 1000° C., thereby to cover the gate electrode 8.

Thereafter, the source electrode 10 and a drain electrode 11 are arranged by metal sputtering at a room temperature, and the films of these electrodes are annealed at 1000° C. Then, the vertical power MOSFET shown in FIG. 1 is finished up.

The vertical power MOSFET thus configured operates in the accumulation mode of the normally-OFF type, and it operates as stated below. First, in a case where a voltage is not applied to the gate electrode 8, the whole region of the surface channel layer 5 becomes depleted of carriers by a potential which is generated by the difference of electrostatic potentials between the p$^-$-type base region 3 and the surface channel layer 5, and the difference of work functions between the surface channel layer 5 and the gate electrode 8.

When, in this state, the voltage is applied to the gate electrode 8, a potential difference which is generated by the sum of the external applied voltage and the difference of the work functions between the surface channel layer 5 and the gate electrode 8 can be changed, whereby the state of a channel can be controlled.

Besides, in the OFF state of the MOSFET, a depletion region is formed with in the surface channel layer 5 by an electric field which is established by the p-type base region 3 and the gate electrode 8. Therefore, when a plus bias is fed to the gate electrode 8 in this state, a channel region which spreads from the n$^+$-type source region 4 toward the n$^-$-type epitaxial layer 2 is formed at the interface between the gate oxide film 7 and the surface channel layer 5, and the MOSFET is switched into an ON state. Thus, electrons flow from the n$^-$-type epitaxial layer 2 (drift region) perpendicularly to the n$^+$-type substrate 1 (n$^+$ drain), via the n$^+$-type source region 4, the surface channel layer 5, to the n$^-$-type epitaxial layer 2 in succession.

In this manner, when the plus voltage is applied to the gate electrode 8, the accumulation type channel can be induced in the surface channel layer 5, and the carriers can be caused to flow between the source electrode 10 and the drain electrode 11.

As described above, in this embodiment, the impurity activation treatment is performed using as the mask, the carbon layer which is formed by carbonizing the resist 23, that is, the material which exhibits the good close adhesion with the underlying SiC.

Therefore, the heat treatment for activating the impurities can be performed in the state where the underlying regions are reliably covered with the carbon layer. Accordingly, the Si escape from the SiC surface can be prevented, and the formation of the carbon-rich layer can be prevented. Thus, the sacrifice oxidation film forming step and the sacrifice oxidation film removing step for removing the carbon-rich layer need not be executed, and the "constriction" ascribable to the execution of the sacrifice oxidation film forming step and the sacrifice oxidation film removing step can be prevented from appearing. It is therefore possible to suppress the thickness nonuniformity of the gate oxide film 7, and to prevent the reliability of the gate oxide film 7 from degrading, in turn, the device characteristics from worsening.

Incidentally, it is stated in the prior art, in case of employing a carbon layer, impurities contained in an organic solvent as in a graphite film of organic type diffuse into an SiC substrate. Since, however, SiC is low in the diffusion rates of the impurities, it is difficult to consider that the impurities contained in the organic solvent will diffuse into the SiC substrate. Fluorescent X-rays/SIMS estimations were actually carried out, and as a result, it was impossible to grasp the fact that the impurities diffused into the SiC substrate. It is also stated that a uniform carbon layer can be formed by a vacuum high-temperature heat treatment under optimum conditions. However, the method in which the organic type solvent is applied can easily form a protective film of more uniform thickness.

Other Embodiments

In the foregoing embodiment, the atmosphere of the heat treatment step for carbonizing the resist 23 or for activating the impurities has been the Ar atmosphere, but the atmosphere may well be a reduced-pressure atmosphere, for example, a vacuum state, which merely lowers the partial pressure of the remaining oxygen. In this case, the remaining oxygen contributes to the burning of the carbon layer or the resist 23 in the course of the formation of the carbon layer, and hence, the concentration of remaining carbon should preferably be set at, at most 1%.

Besides, even when the reduced-pressure atmosphere is not resorted to, an atmosphere in which the remaining oxygen is decreased by replacing oxygen with Ar may well be formed, so as to perform the heat treatment step in the atmosphere. In this case, in order to sufficiently decrease the quantity of the remaining oxygen, the number of times of the replacements with the Ar should preferably be increased. It has been experimentally verified that, when the replacements are made at least three times, the remaining oxygen can be decreased to the degree at which the carbon layer or the resist 23 in the course of the formation of the carbon layer is hardly burnt.

In the foregoing embodiment, the heat treatment profile for forming the carbon layer by carbonizing the resist 23 has been made different from the heat treatment profile for activating the impurities, so as to perform the heat treatment steps having the plurality of heat treatment profiles. This has been intended to form the carbon layer more appropriately.

In contrast, the heat treatment profile for forming the carbon layer and the heat treatment profile for activating the impurities may well be made the same profile. By way of example, the resist 23 may well be carbonized by heating at the temperature rise rate of at least 160° C./min, in agreement with the heat treatment profile for activating the impurities. To the contrary, the impurities may well be activated by heating to about 1600° C. at the temperature rise rate of at most 80° C./min, in agreement with the heat treatment profile for forming the carbon layer.

However, there are the problems that, in the former case, the possibility of the break of the carbon layer heightens on account of the boiling of the organic substance, and that, in the case of the latter, a time period expended on the heat treatment step lengthens. It is therefore favorable to set the plurality of heat treatment profiles as in the embodiment.

In the foregoing embodiment, after the heat treatment temperature has been raised to about 800° C. in order to form the carbon layer, this temperature has been held, whereupon the temperature rise has been directly continued, to heat up to the temperature for activating the impurities. Thus, the higher efficiency of the heat treatment steps is attained.

Figure 7:
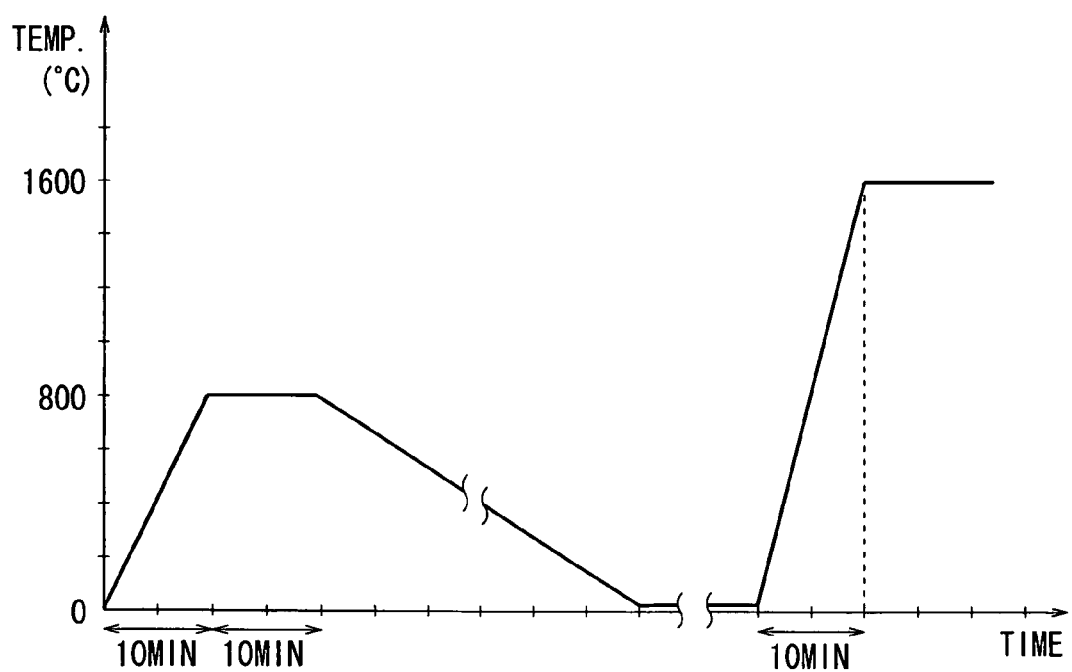
FIG. 7 is a graph showing a thermal process profile in another method for manufacturing the SiC semiconductor device.

In contrast, as in a heat treatment profile shown in FIG. 7 by way of example, a heat treatment temperature may well be once lowered after the formation of the carbon layer, so as to thereafter perform heating for the activation of the impurities again. More specifically, even in a case where the heat treatment step for forming the carbon layer and the heat treatment step for activating the impurities are performed by different apparatuses, the advantages mentioned in the embodiment can be brought forth though the higher efficiency of the heat treatment steps cannot be attained.

Figure 8:
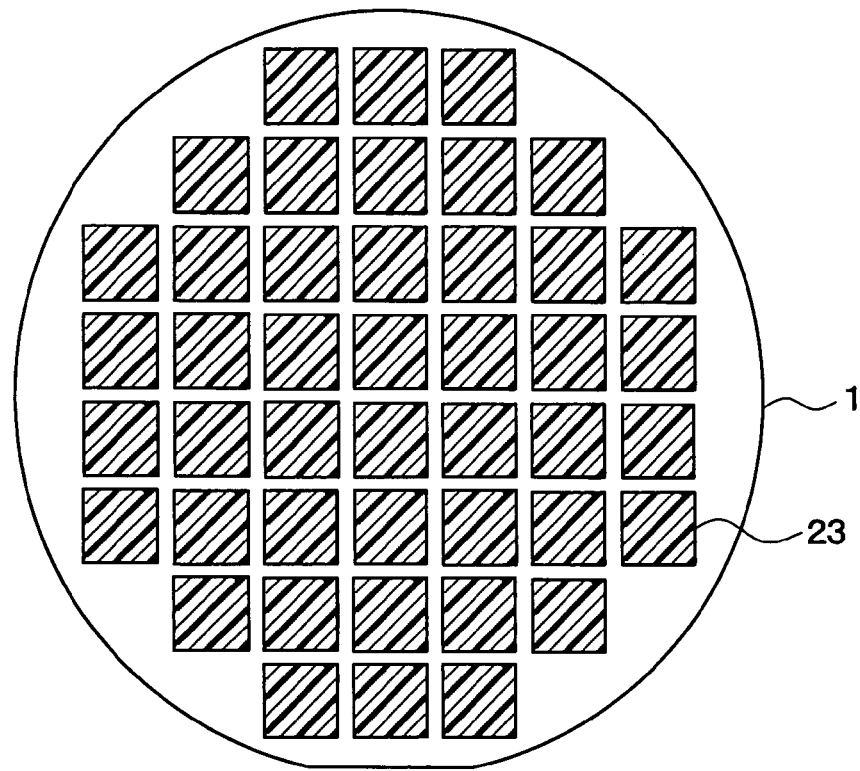
FIG. 8 is a plan view explaining further another method for manufacturing the SiC semiconductor device.
Figure 9:
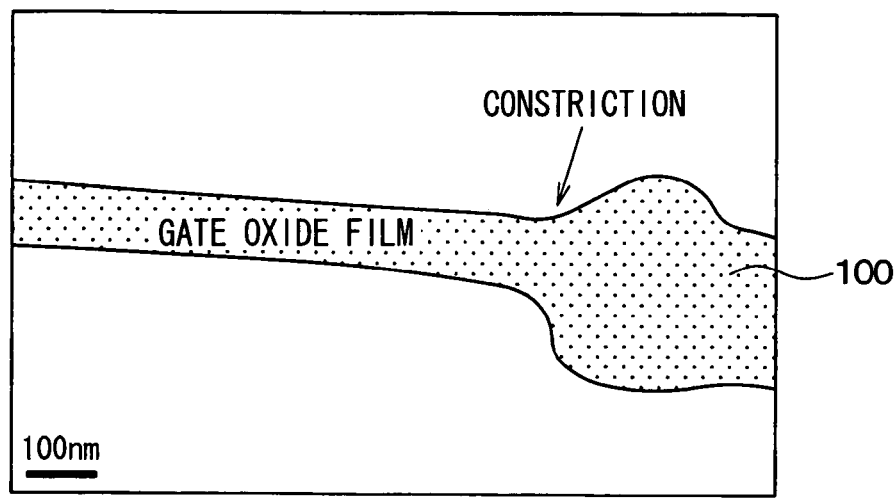
FIG. 9 is a cross sectional view showing a gate oxide film in a SiC semiconductor device according to a related art.

In the foregoing embodiment, the resist 23 has been formed on the whole substrate surface. As illustrated in a shot pattern model diagram shown in FIG. 8, however, the resist 23 may well be divided in chip units so that each divisional resist part may cover a size corresponding to one chip of the SiC semiconductor device, for example, 3 mm-square. In this way, the area of the resist 23 can be divided into the parts, so that the resist 23 can be made difficult to break.

The above disclosure has the following aspects.

According to an aspect of the present disclosure, a method for manufacturing a SiC semiconductor device includes: forming an impurity layer in a SiC semiconductor layer; and forming an oxide film on the SiC semiconductor layer. The forming the impurity layer includes: implanting an impurity ion in the SiC semiconductor layer; forming a carbon layer on the SiC semiconductor layer; heating the SiC semiconductor layer for activating the implanted impurity in the SiC semiconductor layer, wherein the SiC semiconductor layer including the impurity layer is covered with the carbon layer; and removing the carbon layer from the SiC semiconductor layer. The forming the carbon layer includes: coating an organic solvent resist on a surface of the SiC semiconductor layer including the impurity layer; and heating the organic solvent resist for evaporating organic matter in the organic solvent resist so that the organic solvent resist is carbonized. The forming the oxide film is performed after the removing the carbon layer.

In the above method, the carbon layer made from the resist is used as a mask, which contacts the SiC semiconductor layer with excellent adhesiveness, when the impurity in the SiC semiconductor layer is activated. Accordingly, the Si escape from the SiC semiconductor layer is prevented. Thus, the oxide film is appropriately formed on the SiC semiconductor layer, and device characteristics of the SiC device are improved.

Alternatively, the heating the organic solvent resist may have a thermal process profile, which is different from a thermal process profile of the heating the SiC semiconductor layer, and the thermal process profile of the heating the organic solvent resist may include a rate of temperature increase, which is smaller than a rate of temperature increase of the thermal process profile of the heating the SiC semiconductor layer. In this case, the organic matter in the resist is not heated rapidly and boiled; and therefore, the resist is protected from being broken.

Alternatively, the heating the organic solvent resist may be performed in a temperature range between 200° C. and 850° C., and the heating the SiC semiconductor layer may be performed at a temperature equal to or higher than 1600° C. The heating the SiC semiconductor layer is successively performed after the heating the organic solvent resist in such a manner that a temperature is increased until a process temperature of the heating the organic solvent resist, the temperature is maintained during a predetermined time, and the temperature is increased until a process temperature of the heating the SiC semiconductor layer.

Alternatively, the heating the organic solvent resist may be performed in a temperature range between 200° C. and 850° C., and the heating the SiC semiconductor layer may be performed at a temperature equal to or higher than 1600° C. The heating the SiC semiconductor layer is successively performed after the heating the organic solvent resist in such a manner that a temperature is increased until a process temperature of the heating the organic solvent resist, the temperature is maintained during a predetermined time, the temperature is decreased until a predetermined temperature, and the temperature is increased until a process temperature of the heating the SiC semiconductor layer.

Alternatively, the forming the carbon layer may further include dividing the organic solvent resist into a plurality of chip units, and the dividing the organic solvent resist is performed after the coating the organic solvent resist and before the heating the organic solvent resist.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a SiC semiconductor device comprising:
   forming an impurity layer in a SiC semiconductor layer; and
   forming an oxide film on the SiC semiconductor layer, wherein
      the forming the impurity layer includes:
         implanting an impurity ion in the SiC semiconductor layer;
         forming a carbon layer on the SiC semiconductor layer;
         heating the SiC semiconductor layer for activating the implanted impurity in the SiC semiconductor layer, wherein the SiC semiconductor layer including the impurity layer is covered with the carbon layer; and
         removing the carbon layer from the SiC semiconductor layer, the forming the carbon layer includes:
         coating an organic solvent resist on a surface of the SiC semiconductor layer including the impurity layer;
         reducing atmospheric pressure around the SiC semiconductor layer to be equal to or lower than $1 \times 10^{-4}$ Pa; and
         heating the organic solvent resist for evaporating organic matter in the organic solvent resist so that the organic solvent resist is carbonized,
      the heating the organic solvent resist is performed in a temperature range between 200° C. and 850° C., and
      the forming the oxide film is performed after the removing the carbon layer.

2. The method according to claim 1, wherein
   the heating the organic solvent resist has a thermal process profile, which is different from a thermal process profile of the heating the SiC semiconductor layer, and
   the thermal process profile of the heating the organic solvent resist includes a rate of temperature increase, which is smaller than a rate of temperature increase of the thermal process profile of the heating the SiC semiconductor layer.

3. The method according to claim 2, wherein the rate of temperature increase in the heating the organic solvent resist is equal to or smaller than 80° C. per minute.

4. The method according to claim 2, wherein the rate of temperature increase in the heating the SiC semiconductor layer is equal to or larger than 160° C. per minute.

5. The method according to claim 1, wherein the heating the SiC semiconductor layer is performed at a temperature equal to or higher than 1600° C.

6. The method according to claim 1, wherein the heating the SiC semiconductor layer is performed at a temperature equal to or higher than 1600° C., and the heating the SiC semiconductor layer is successively performed after the heating the organic solvent resist in such a manner that a temperature is increased until a process temperature of the heating the organic solvent resist, the temperature is maintained during a predetermined time, and the temperature is increased until a process temperature of the heating the SiC semiconductor layer.

7. The method according to claim 1, wherein the removing the carbon layer is performed in such a manner that the carbon layer is oxidized at a temperature equal to or lower than 850° C.

8. The method according to claim 1, further comprising: cleaning the surface of the SiC semiconductor layer including the impurity layer after the removing the carbon layer and before the forming the oxide film.

9. The method of claim 1, wherein the heating the organic solvent resist is performed in a decompressed argon atmosphere.

10. The method according to claim 1, wherein the heating the organic solvent resist is performed in an atmosphere including an oxygen gas equal to or lower than 1 vol. %.

11. The method according to claim 1, wherein the heating the organic solvent resist is performed in an atmosphere, in which a residual oxygen gas is replaced by an argon gas.

12. The method according to claim 1, wherein the forming the carbon layer further includes dividing the organic solvent resist into a plurality of chip units, and the dividing the organic solvent resist is performed after the coating the organic solvent resist and before the heating the organic solvent resist.

13. A method for manufacturing a SiC semiconductor device comprising:
forming an impurity layer in a SiC semiconductor layer; and
forming an oxide film on the SiC semiconductor layer, wherein
the forming the impurity layer includes:
implanting an impurity ion in the SiC semiconductor layer;
forming a carbon layer on the SiC semiconductor layer;
heating the SiC semiconductor layer for activating the implanted impurity in the SiC semiconductor layer, wherein the SiC semiconductor layer including the impurity layer is covered with the carbon layer; and
removing the carbon layer from the SiC semiconductor layer,
the forming the carbon layer includes:
coating an organic solvent resist on a surface of the SiC semiconductor layer including the impurity layer;
reducing atmospheric pressure around the SiC semiconductor layer to be equal to or lower than $1 \times 10^{-4}$ Pa; and
heating the organic solvent resist for evaporating organic matter in the organic solvent resist so that the organic solvent resist is carbonized,
the heating the organic solvent resist is performed in a temperature range between 200° C. and 850° C.,
the heating the SiC semiconductor layer is performed at a temperature equal to or higher than 1600° C.,
the heating the SiC semiconductor layer is successively performed after the heating the organic solvent resist in such a manner that a temperature is increased until a process temperature of the heating the organic solvent resist, the temperature is maintained during a predetermined time, the temperature is decreased until a predetermined temperature, and the temperature is increased until a process temperature of the heating the SiC semiconductor layer, and
the forming the oxide film is performed after the removing the carbon layer.

* * * * *